(12) United States Patent
Deimling

(10) Patent No.: US 7,440,791 B2
(45) Date of Patent: Oct. 21, 2008

(54) DOUBLE ECHO MAGNETIC RESONANCE IMAGING SEQUENCE AND APPARATUS FOR THE IMPLEMENTATION THEREOF

(75) Inventor: Michael Deimling, Moehrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 563 days.

(21) Appl. No.: 10/299,748

(22) Filed: Nov. 19, 2002

(65) Prior Publication Data

US 2003/0100827 A1    May 29, 2003

(30) Foreign Application Priority Data

Nov. 23, 2001  (DE) ................................ 101 57 540

(51) Int. Cl.
A61B 5/05       (2006.01)
(52) U.S. Cl. ....................... 600/410; 324/306; 324/307; 324/309; 324/318; 600/407
(58) Field of Classification Search ................. 324/306, 324/307, 309; 600/407, 410
See application file for complete search history.

(56) References Cited

U.S. PATENT DOCUMENTS

| | | | |
|---|---|---|---|
| 4,825,159 A | | 4/1989 | Oppelt et al. |
| 4,973,906 A | * | 11/1990 | Bernstein ..................... 324/309 |
| 5,034,692 A | * | 7/1991 | Laub et al. ................... 324/309 |
| 5,170,122 A | | 12/1992 | Bernstein |
| 5,280,244 A | * | 1/1994 | Hinks ......................... 324/306 |
| 5,602,476 A | * | 2/1997 | Liu et al. ..................... 324/309 |
| RE35,656 E | * | 11/1997 | Feinberg et al. ............. 324/309 |
| 6,160,397 A | * | 12/2000 | Washburn et al. ........... 324/309 |
| 6,583,623 B1 | * | 6/2003 | Kwok et al. ................. 324/307 |

FOREIGN PATENT DOCUMENTS

| | | |
|---|---|---|
| EP | 0 633 480 | 1/1995 |
| EP | 0 959 366 | 11/1999 |
| EP | 1 209 482 | 5/2002 |

OTHER PUBLICATIONS

"A New Steady-State Imaging Sequence for Simultaneous Acquisition of Two MR Images with Clearly Different Contrasts," Bruder et al. Magnetic Resonance in Medicine, vol. 7 (1988) pp. 35-42.
A Comprehensive Technical Review of Short TR, Fast Magnetic Resonance Imaging, Haacke et al., Review of Magnetic Resonance in Medicine, vol. 3, No. (1991), pp. 53-170.
"Elimination of Oblique Flow Artifacts in Magnetic Resonance Imaging," Frank et al., Magnetic Resonance in Imaging, vol. 25, (1992), pp. 299-307.
"MR Angiography with Gradient Motion Refocusing," Laub et al., J. of Computer Assisted Tomography, vol. 12, No. 3, (1988) pp. 377-382.

* cited by examiner

Primary Examiner—Brian L. Casler
Assistant Examiner—John F Ramirez
(74) Attorney, Agent, or Firm—Schiff Hardin LLP

(57) ABSTRACT

In a magnetic resonance imaging method and apparatus, a double echo sequence having a gradient echo and a spin echo is implemented with a flow compensation for the gradient echo in at least one direction. The flow compensation gives the double echo sequence an insensitivity to flow phenomena.

12 Claims, 4 Drawing Sheets

DOUBLE ECHO MAGNETIC RESONANCE IMAGING SEQUENCE AND APPARATUS FOR THE IMPLEMENTATION THEREOF

BACKGROUND OF THE INVENTION

1. Field of the Invention

The present invention is directed to a double echo sequence and to a magnetic resonance apparatus for the implementation of the double echo sequence.

2. Description of the Prior Art

Magnetic resonance technology is a known technique for, among other things, acquiring images of the inside of the body of an examination subject. In a magnetic resonance apparatus, rapidly switched gradient fields that are generated by a gradient system are superimposed on a static, basic magnetic field that is generated by a basic field magnet system. The magnetic resonance apparatus also has a radio-frequency system that radiates radio-frequency signals into the examination subject for triggering magnetic resonance signals, and picks up the generated magnetic resonance signals, from which magnetic resonance images are produced.

In an image acquisition mode, the magnetic resonance apparatus is controlled on the basis of a sequence executed in a central control system of the magnetic resonance apparatus such that, among other things, the gradient fields are switched at the proper time with defined intensity, the radio-frequency signals are emitted at the proper time, and the magnetic resonance signals are picked up at the proper time.

A multitude of different sequences are known in magnetic resonance technology, with magnetic resonance images having different imaging properties being able to be generated with the various sequences. A double echo sequence includes a gradient echo and a spin echo, and is employed often in orthopedics, for example for generating images of the knee of a patient, and is known under the acronym DESS (Double Echo Steady State). Further details about the double echo sequence are disclosed, for example, by European Application 0 288 861 and in the article by H. Bruder et al., "A New Steady-State Imaging Sequence for Simultaneous Acquisition of Two MR Images with Clearly Different Contrasts", Magnetic resonance in Medicine 7 (1988) pages 35-42.

The double echo sequence corresponds to a combination of a refocused gradient echo sequence, which is known, among other things, by the acronym FISP (Fast Imaging with Steady State Precision and a sequence wherein a spin echo based on a refocusing partial effect of each radio-frequency signal is utilized and that is known, among other things, by the acronym PSIF. The acronym PSIF is a reversal of the order of the letters of the acronym FISP since the pattern of radio-frequency signal and gradient of the PSIF sequence approximately corresponds to a FISP sequence implemented in reverse. The FISP sequence is distinguished among gradient sequences by comparatively strong magnetic resonance signals since the longitudinal as well as the transverse magnetization, held in an equilibrium state are utilized for imaging. Magnetic resonance images having a dominant T1/T2 contrast can thereby be generated with the FISP sequence. By contrast, the magnetic resonance images generated with the PSIF sequence exhibit a strong T2 weighting. The double echo sequence supplies two three-dimensional (for example) datasets, one of the datasets belonging to the gradient echoes and one to the spin echoes. A combination of the two datasets then yields a corresponding dataset, and thus a magnetic resonance image of the double echo sequence.

The article by E. M. Haacke et al., "A Comprehensive Technical Review of Short TR, Fast, Magnetic resonance Imaging", Reviews of Magnetic resonance in Medicine, vol. 3, no. 2, 1991, pages 53-170, a variant of the PSIF sequence, which is called ROAST (Resonant Offset Averaging in the STeady State) wherein at least one sub-region of a region to be imaged that flows during the image acquisition, for example slowly flowing blood, can experience such a pronounced dephasing that this sub-region supplies to signal contribution to the magnetic resonance image.

It is also known that a number of artifacts can appear in the magnetic resonance image given an imaged region wherein flow phenomena, for example an arterial blood flow, occur. The two most striking effects are a reduction of the magnetic resonance signal as a consequence of an incoherent addition of phases of the individual spins within a picture element, and the formation of a number of ghost images as a consequence of the pulsating blood flow during the heart cycle. Since both effects exhibit a proportionality to the first time moment of the gradient fields that are utilized, the aforementioned artifacts can be reduced by means of a flow compensation, by setting the first moment to zero. For example, a triple gradient pulse instead of a bipolar gradient pulse is utilized in a slice selection direction and frequency coding direction. For this purpose, for example, a unipolar gradient pulse is replaced by a bipolar gradient pulse in the phase-coding direction. The reason for the differences in the flow compensation between the slice selection gradient and the frequency-coding gradient between the slice selection gradient and the phase-coding gradient is that the phase coding is configured for producing a finite $0^{th}$ moment, in contrast to which the frequency coding and the slice selection are not configured in this manner, but instead are intentionally designed usually as bipolar gradient pulses without flow compensation. This flow compensation is therefore also referred to in the literature as gradient moment rephasing. gradient motion refocusing or gradient moment cancellation. This is explained in greater detail in the article by L. R. Frank et al., "Elimination of Oblique Flow Artifacts in Magnetic resonance Imaging", Magnetic Resonance in Medicine 25 (1992), pages 299-307. The topic of flow compensation is addressed in the article by G. A. Laub et al., "MR Angiography with Gradient Motion Refocusing", Journal of Computer Assisted Tomography 12 (3), 1988, pages 377-382.

SUMMARY OF THE INVENTION

An object of the present invention is to provide an improved double echo sequence with a gradient echo and a spin echo as well as a magnetic resonance apparatus for the implementation of such a method, so that a high insensitivity to flow phenomena is achieved with an optimally low complexity of the sequence.

This object is achieved in accordance with the invention in a method wherein a double echo sequence having a gradient echo and a spin echo is executed, with a flow compensation in at least one direction for the gradient echo.

With targeted use of the effect described by E. M. Haacke et al., that the magnetization in view of the spin echo is nearly completely destroyed at locations of a strong pulse-like flow, and thus no artifact-generated contribution to the spin echo and ultimately to the magnetic resonance image of the double echo sequence is supplied at these locations, a motion-compensating gradient switching is only realized in view of the gradient echo, a high insensitivity to flow phenomena is advantageously achieved with a reasonably uncomplicated gradient pattern. Compared thereto, a flow compensation for the spin echo as well would result in a clearly more complex gradient pattern given an insensitivity that is not any higher, or barely higher, which would have a negative influence due, among other things, to a longer measuring time and a higher power demand in the gradient system.

DESCRIPTION OF THE PREFERRED EMBODIMENTS

Figure 1:
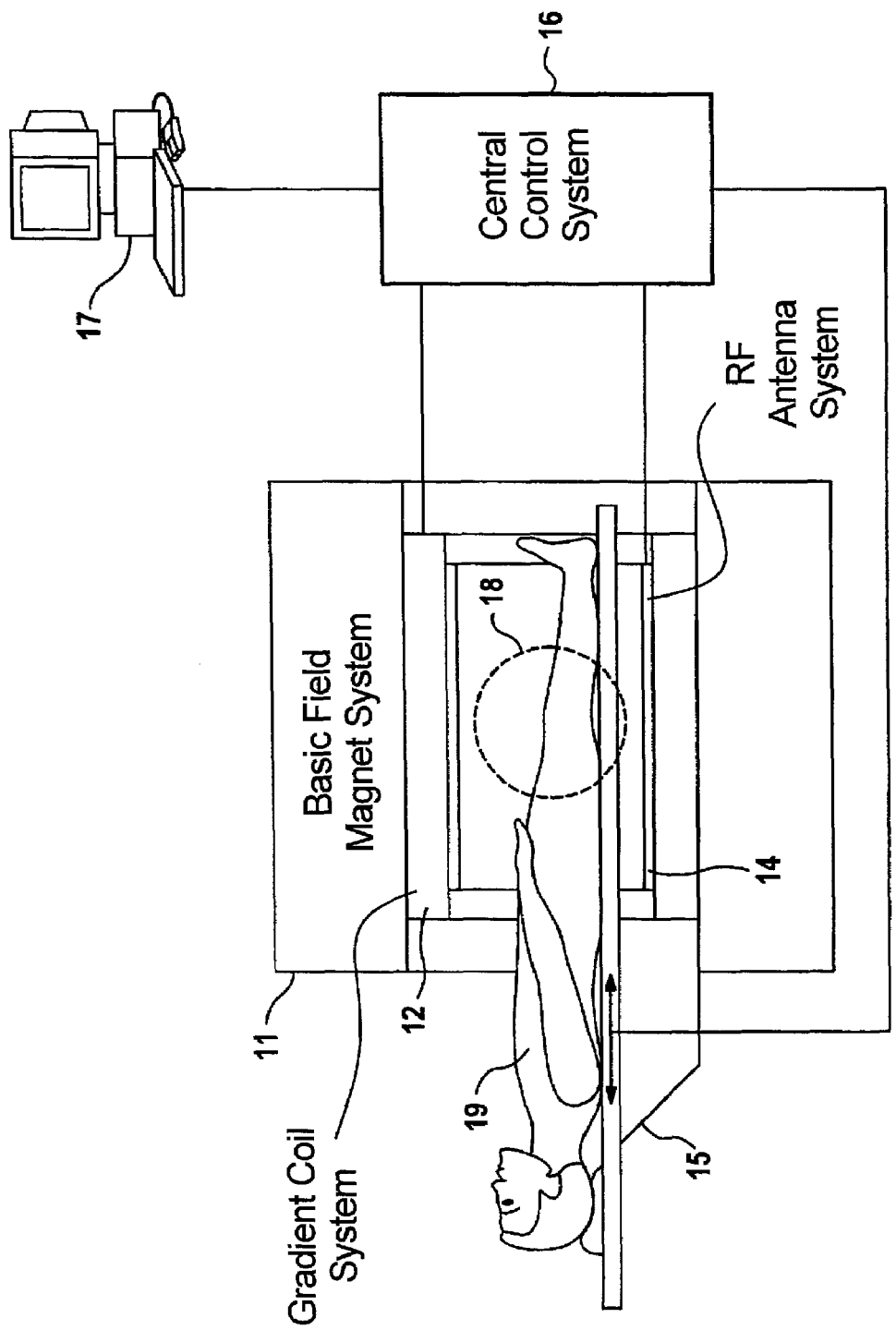
FIG. 1 schematically illustrates a sketch of a magnetic resonance apparatus for executing the inventive method.

FIG. 1 shows a magnetic resonance apparatus thereby comprises a basic field magnet system 11 for generating a basic magnetic field and a gradient coil system 12 for generating gradient fields. The magnetic resonance apparatus also has an antenna system 14 that emits radio-frequency signals into an examination subject for triggering magnetic resonance signals and picks up the magnetic resonance signals that are produced. The magnetic resonance apparatus also has a displaceable support mechanism 15 on which the examination subject, for example a patient 19 to be examined, is placed.

For controlling currents in the gradient coil system 12 on the basis of a sequence, the gradient coil system 12 is connected to a central control system 16. For controlling the radio-frequency signals to be emitted according to the sequence as well as for the further-processing and storing of the magnetic resonance signals picked up by the antenna system 14, the antenna system 14 is likewise connected to the central control system 16. For controlling a displacement of the support mechanism 15, for example in order to position the knee of the patient 19 in an imaging volume 18 of the apparatus as the region to be imaged, the support mechanism 15 is also connected to the central control system 16. The central control system 16 is connected to a display and operating device 17 via which inputs of an operator are supplied to the central control system 16, for instance the desired sequence type and sequence parameters. Among other things, the generated magnetic resonance images are also displayed at the display and operating device 17.

Figure 2:
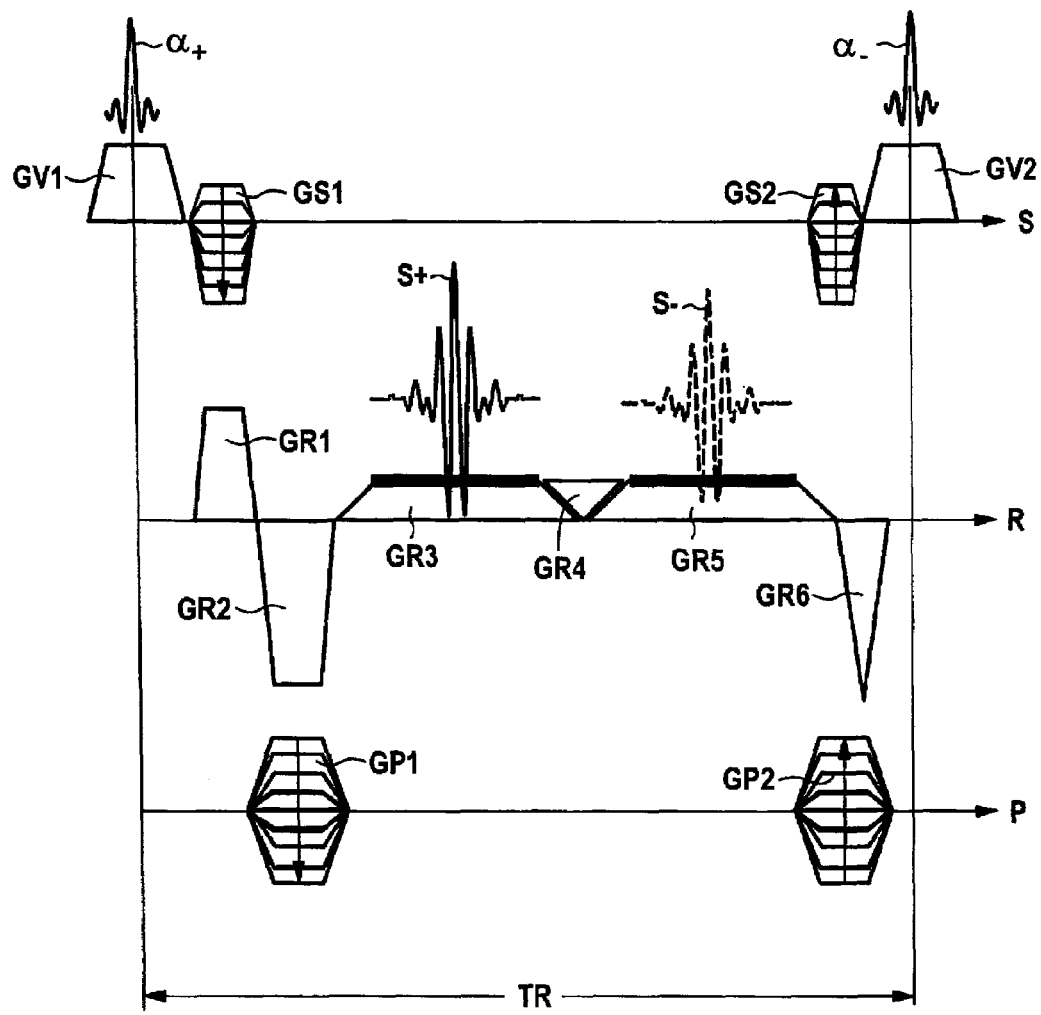
FIG. 2 illustrates a radio-frequency signal and gradient pattern of a double echo sequence for generating a three-dimensional dataset with a flow compensation in readout direction.

As an exemplary embodiment of the invention, FIG. 2 shows a radio-frequency signal and gradient pattern of a double echo sequence for generating a three-dimensional dataset with a flow compensation exclusively in a readout direction R. For explaining the double echo sequence, the magnetic resonance apparatus shown in FIG. 1 shall be referenced as an example.

In accordance with the radio-frequency signal and gradient pattern of the double echo sequence, the antenna system 14 emits a first radio-frequency signal α+ into the examination subject simultaneously with a gradient pulse GV1 activated in a first phase-coding direction S. The gradient pulse GV1 has the function of selecting a volume or slice thickness to be further spatially resolved, for example the region of a knee of the patient 19, for the stimulus effect of the radio-frequency signal α.

Following thereupon, a triple gradient pulse comprising the gradient pulses GR1, GR2 and GR3 is activated in the readout direction R. During the gradient pulse GR3, a gradient echo signal S+ is acquired by the antenna system 14 during a time duration identified with a bold-face line and is entered into a first dataset that is stored in the central control system 16. The triple gradient pulse effects the formation of the gradient echo signal S+ as well as a flow compensation of flow phenomena occurring in the readout direction R, so that artifacts are avoided in the appertaining image of the dataset.

During the duration of the gradient pulses GR1 and GR2, a gradient pulse GS1 in the first phase-coding direction S and a gradient pulse GP1 in a second phase-coding direction P are activated for phase coding, so that a three-dimensional spatial resolution of the region to be imaged is achieved.

After the gradient pulse GR3, a further gradient pulse GR5 is activated in the readout direction R for the acquisition of a spin echo signal S−. The spin echo signal S− results from a radio-frequency excitation (not shown) that precedes the radio-frequency signal α+ in time, the magnetic resonance signal excited as a result thereof experiencing a corresponding refocusing by means of the radio-frequency signal α+. During the gradient pulse GR5, the spin echo signal S− is acquired by the antenna system 14 during a time duration that is again indicated with a bold-face line and is entered in a second dataset that is likewise stored in the central control system 16. In practice, the gradient pulses GR3 and GR5 are activated, for simplicity, as one gradient pulse by adding the gradient time area GR4.

After the acquisition of the spin echo signal S− has ended, a gradient pulse GS2 in the first phase-coding direction S, a gradient pulse GR6 in the readout direction R and a gradient pulse GP2 in the second phase-coding direction P are activated for a complete refocusing.

The above-described pattern sequencing during a repetition time TR is then repeated until all measured data have been acquired for the selected, three-dimensional topical resolution, whereby the gradient pulses GS1 and GP1 in conjunction with the refocusing gradient pulses GS2 and GP2 belonging to them are incremented or, respectively, de-incremented with respect to their gradient intensity from repetition to repetition. Further, the radio-frequency signal is transmitted with an alternating operational sign from repetition to repetition, so that a radio-frequency signal α_ shown in FIG. 2 comprises a 180° phase offset compared to the temporally preceding radio-frequency signal α_+. A gradient pulse GV2 activated during the transmission of the radio-frequency signal α_ corresponds to the gradient pulse GV1 applied when transmitting the radio-frequency signal α_+.

A dataset belonging to the double echo sequence is combined from the three-dimensional datasets that are completely occupied with data. The first dataset results from measured data of the gradient echo signals S+ and the second dataset S− results from measured data of the spin echo signals S−. The magnetic resonance images produced from this double echo sequence dataset is displayed at the display and operating device 17.

Figure 3:
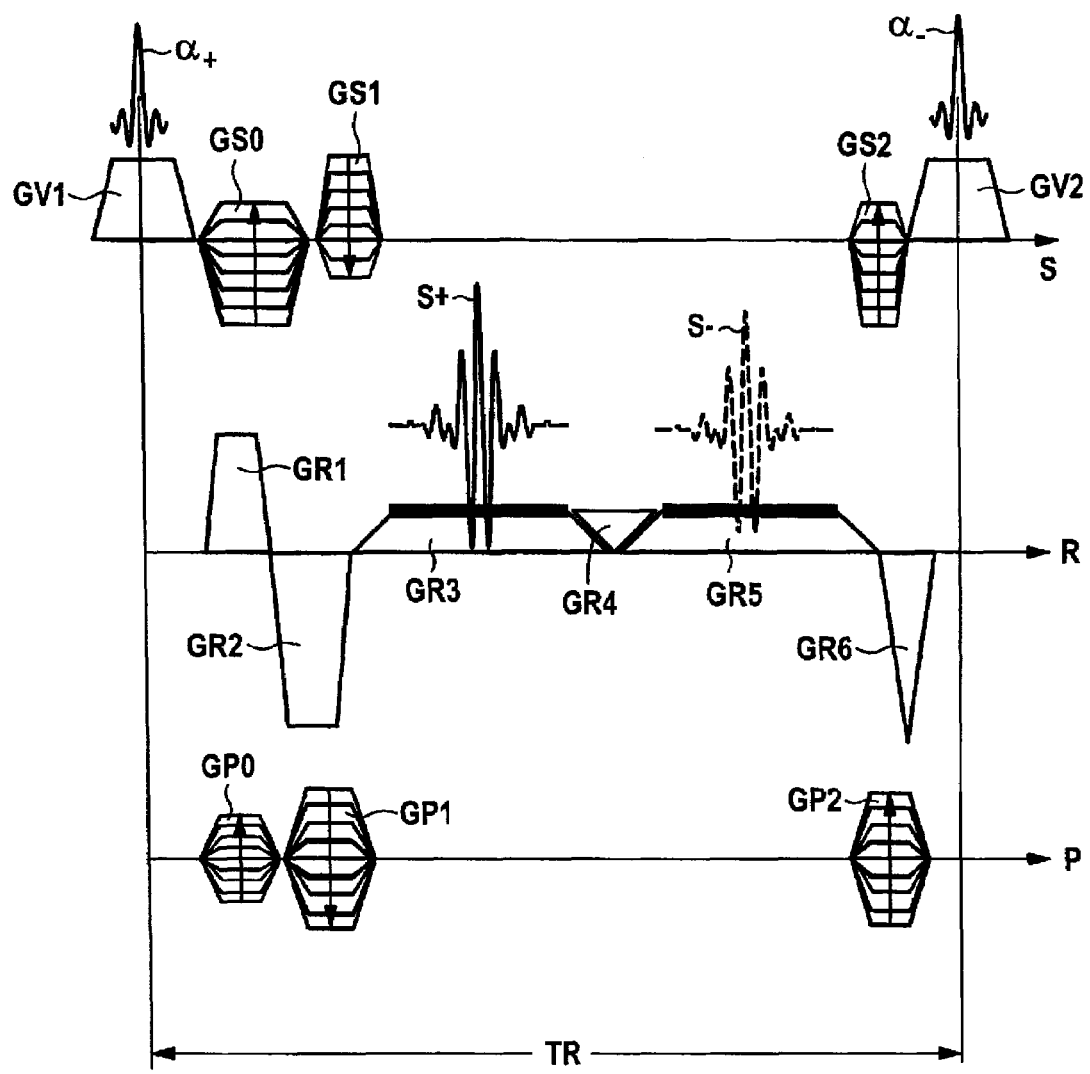
FIG. 3 illustrates a radio-frequency signal and gradient pattern of a double echo sequence for generating a three-dimensional dataset with flow compensation in all three directions.

As a further exemplary embodiment of the invention, FIG. 3 shows a radio-frequency signal and gradient pattern for a double echo sequence with a flow compensation in all three directions. Compared to the radio-frequency signal and gradient pattern shown in FIG. 2, additional gradient pulses GS0 and GP0 are also utilized in the two phase-coding directions for a complete flow compensation. The bipolar gradient pulse that thus arises and includes the gradient pulses GS0 and GS1 thus produces a flow compensation in the first phase-coding direction S at the point in time at which the gradient echo signal S+ has its maximum. The same applies to the second phase-coding direction P. Otherwise, that described for FIG. 2 applies.

Figure 4:
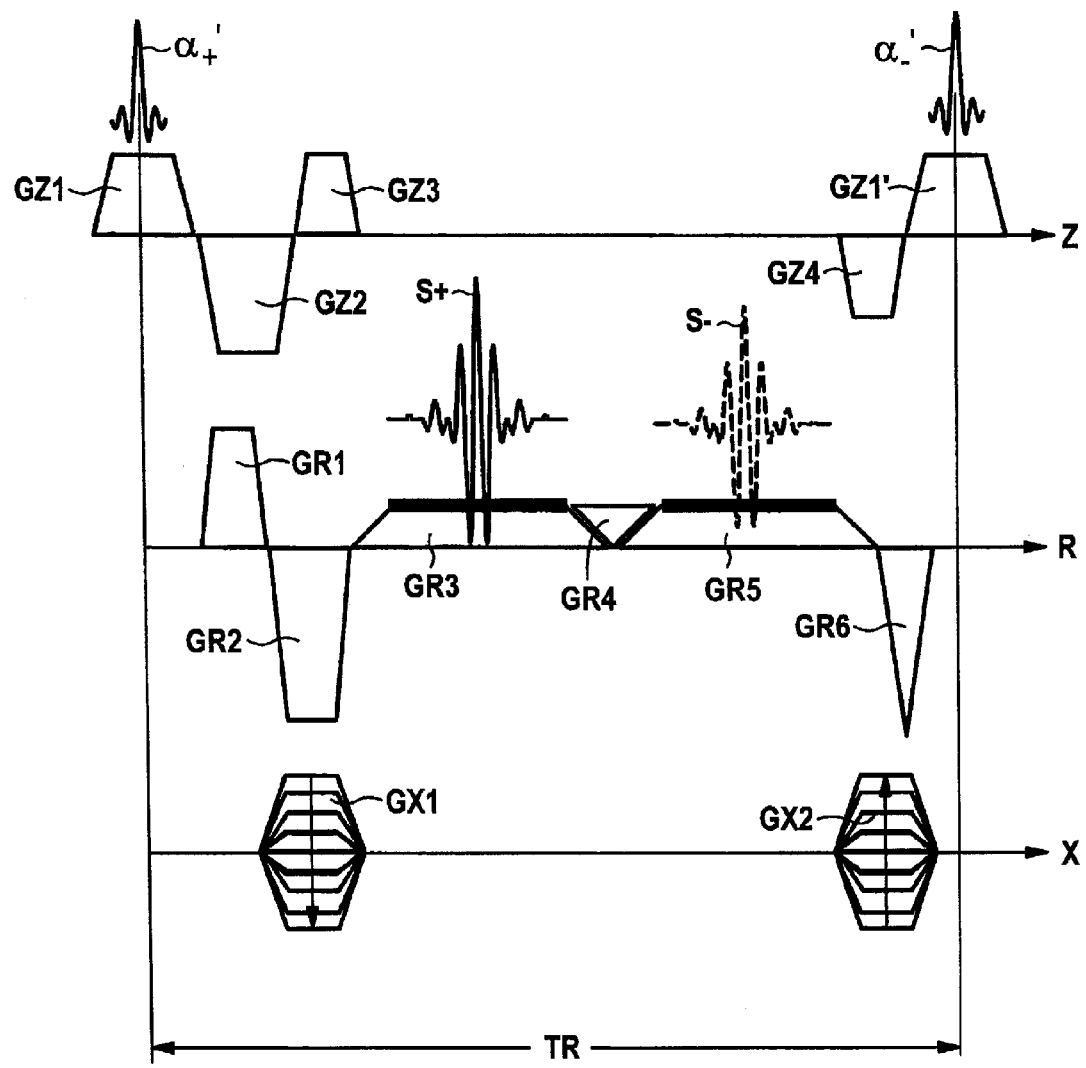
FIG. 4 illustrates a radio-frequency signal and gradient pattern of a double echo sequence for generating a two-dimensional dataset with flow compensation in the slice selection direction and the readout direction.

As a further exemplary embodiment of the invention, FIG. 4 shows a radio-frequency signal and gradient pattern for a double echo sequence for generating a two-dimensional dataset with a flow compensation in a slice selection direction Z and the readout direction R. Compared to the radio-frequency signal and gradient pattern shown in FIG. 2, a slice selection direction Z in FIG. 4 replaces the first phase-coding direction S and a sole phase-coding direction X replaces the second phase-coding direction P. The discussion with regard to FIG. 2 about the second phase-coding direction P and its gradient pulses GP1 and GP2 applies correspondingly in FIG. 4 for the phase-coding direction X and the gradient pulses GX1 and GX2. Further, the rest of that set forth for FIG. 2 applies correspondingly for FIG. 4.

Given the radio-frequency signal and gradient pattern of FIG. 4, a first radio-frequency signal $\alpha+'$ is transmitted in the slice selection direction simultaneously with a slice-selective gradient pulse GZ1 for the excitation of a corresponding slice. The gradient pulses GZ2 and GZ3 are activated immediately following the gradient pulse GZ1. The gradient pulses GZ1, GZ2 and GZ3 form a triple gradient pulse that produces a corresponding flow compensation for the slice selection direction Z. After the signal acquisition has been completed, a gradient pulse GZ4 is activated for a refocusing in the slice selection direction Z.

In the repetitions of the pattern sequencing with the repetition time TR, the radio-frequency signal is transmitted with an alternating operational sign from repetition to repetition for the acquisition of all data for the slice corresponding to FIG. 2, so that a radio-frequency signal $\alpha-'$ shown in FIG. 4 has a 180° phase offset compared to the temporally preceding radio-frequency signal $\alpha_+'$. A gradient pulse GZ1' activated during the transmission of the radio-frequency signal $\alpha_-'$, thereby corresponds to the gradient pulse GZ1 applied when transmitting the radio-frequency signal $\alpha_+'$.

The pattern of FIG. 4 can be correspondingly repeated for further slices, for example slices neighboring the aforementioned slice. Compared to the generation of a three-dimensional dataset described in FIG. 2, it is not necessary for slices that are allocated to edge regions of the three-dimensional dataset and that are not to be consulted for a diagnosis, to be acquired together with the slices of diagnostic interest, so that a shorter measurement time results. Further, fewer phase-coding artifacts occur given the slice-by-slice acquisition corresponding to FIG. 4 compared to the generation of a three-dimensional dataset corresponding to FIG. 2.

In another embodiment, a flow compensation is also provided in the phase-coding direction X in the pattern of FIG. 4, similar to the pattern of FIG. 3.

In yet another embodiment, a centric phase coding can be utilized instead of the linear phase coding shown in FIG. 4 wherein the gradient pulses GX1 and GX2 of the phase-coding direction X are switched in steps from a minimum value to a maximum value or, respectively, vice versa. In centric phase coding, a magnetic resonance signal, with which a central row of a k-space matrix belonging to the dataset is filled, is acquired following one or more preparation radio-frequency signals as a result of a first radio-frequency signal, for example the radio-frequency signal $\alpha_+'$, and a gradient pulse in the phase-coding direction X that has an amplitude corresponding to a step height of the phase coding. In repetitions following thereupon, the gradient pulse—for filling further rows—is applied with an amplitude corresponding to the operational sign-inverted step height, corresponding to double the step height, corresponding to double the operational sign-inverted step height, to three times the step height, etc. This is advantageous because the middle rows of the k-space matrix, which, as known, are critical for the image contrast, are acquired immediately with the largest possible transverse magnetization and, thus, high signal strength. After a few repetitions, the longitudinal magnetization settles onto a dynamic equilibrium value during which the other rows are then filled.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a magnetic resonance imaging apparatus comprising the steps of:
executing a double echo sequence that is a combination of a FISP sequence and a PSIF sequence, including generating a triple gradient pulse in a readout direction having an operation sign that changes from pulse-to-pulse, to read out a gradient echo and a spin echo that are non-superimposed and that are separate from each other; and
implementing a flow compensation for said gradient echo in at least to said readout direction to give said double echo sequence an insensitivity to flow phenomena.

2. A method as claimed in claim 1 comprising implementing said flow compensation in a slice selection direction.

3. A method as claimed in claim 2 comprising, for said flow compensation, generating a triple gradient pulse having an operation sign that changes from pulse-to-pulse.

4. A method as claimed in claim 1 comprising implementing said flow compensation in a phase-coding direction.

5. A method as claimed in claim 4 comprising, for said flow compensation, generating a bipolar gradient pulse.

6. A method as claimed in claim 1 comprising executing said double echo sequence with said flow compensation to obtain data for an orthopedic diagnosis.

7. A magnetic resonance apparatus comprising:
a magnetic resonance scanner including a gradient coil system and a radio-frequency system; and
a sequence controller configured to operate said magnetic resonance scanner to execute a double echo sequence that is a combination of a FISP sequence and a PSIF sequence, including being configured to generate a triple gradient pulse in a readout direction having an operation sign that changes from pulse-to-pulse, to read out a gradient echo and a spin echo that are non-superimposed and that are separate from each other, and being configured to implement a flow compensation for said gradient echo in at least said readout direction to give said double echo sequence an insensitivity to flow phenomena, to obtain data for producing a magnetic resonance image.

8. A magnetic resonance apparatus as claimed in claim 7 wherein said sequence controller operates said scanner to implement said flow compensation in a slice selection direction.

9. A magnetic resonance apparatus as claimed in claim 8 wherein said sequence controller operates said scanner to generate a triple gradient pulse, for said flow compensation, having an operational sign that changes from pulse-to-pulse.

10. A magnetic resonance apparatus as claimed in claim 7 wherein said sequence controller operates said scanner to implement said flow compensation in a phase-coding direction.

11. A magnetic resonance apparatus as claimed in claim 10 wherein said sequence controller operates said scanner to generate a bipolar gradient pulse for said flow compensation.

12. A magnetic resonance apparatus as claimed in claim 7 wherein said sequence controller operates said scanner to obtain said data for an orthopedic diagnosis.

* * * * *